(12) United States Patent
Shiraishi

(10) Patent No.: US 7,598,618 B2
(45) Date of Patent: Oct. 6, 2009

(54) SEMICONDUCTOR DEVICE

(75) Inventor: Yasushi Shiraishi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 285 days.

(21) Appl. No.: 11/678,619

(22) Filed: Feb. 26, 2007

(65) Prior Publication Data

US 2007/0216020 A1 Sep. 20, 2007

(30) Foreign Application Priority Data

Mar. 15, 2006 (JP) ............................. 2006-070286

(51) Int. Cl.
*H01L 23/48* (2006.01)
*H01L 29/40* (2006.01)

(52) U.S. Cl. ...................... 257/777; 257/686
(58) Field of Classification Search ................. 257/777, 257/723–724, 686, E27.137, E27.144, E27.161
See application file for complete search history.

(56) References Cited

U.S. PATENT DOCUMENTS 6,914,322 B2 * 7/2005 Iijima et al. ................. 257/678

2007/0126085 A1 * 6/2007 Kawano et al. ............. 257/621

FOREIGN PATENT DOCUMENTS

JP 11-3969 A 1/1999

* cited by examiner

*Primary Examiner*—Theresa T Doan
(74) *Attorney, Agent, or Firm*—Volentine & Whitt, P.L.L.C.

(57) ABSTRACT

A semiconductor device that enables the transmission time of a signal and implementation area to be reduced, and a method for manufacturing the same. A semiconductor device includes a first semiconductor substrate, a capacitor chip, an external input terminal, and an external output terminal. The first semiconductor chip includes a first surface, a second surface, an eleventh through-hole electrode, a twelfth through-hole electrode, and a thirteenth through-hole electrode. The capacitor is laminated on the first semiconductor chip and includes a third surface. A capacitor element is formed on the third surface. The capacitor element functions as a condenser component in the periphery of the first semiconductor chip. The external input terminal is electrically coupled to the capacitor element and the twelfth through-hole electrode through the eleventh through-hole electrode. The external output terminal is coupled to the circuit element through the thirteenth through-hole electrode.

3 Claims, 10 Drawing Sheets

SEMICONDUCTOR DEVICE

CROSS-REFERENCE TO RELATED APPLICATIONS

This application claims priority to Japanese Patent Application No. 2006-070286. The entire disclosure of Japanese Patent Application No. 2006-070286 are hereby incorporated herein by reference.

BACKGROUND OF THE INVENTION

1. Field of the Invention

The present invention relates to a semiconductor device and a method for manufacturing the same.

2. Background Information

A semiconductor device in which a single or plurality of semiconductor chip(s) in which a circuit element is formed and a single or plurality of capacitor chip(s) in which a capacitor element is formed are laminated has been proposed in the past. For example, Japan Patent Application Publication JP-A-H11-003969 (especially pages 1 to 8, and FIGS. 1 to 8) discloses this type of semiconductor device.

In the art disclosed in the above described publication, a semiconductor chip in which a circuit element is formed, and a capacitor chip in which a capacitor element is formed, are connected through a bonding wire. Here, the bonding wire tends to be broken into two if sharply bent. Because of this, bonding pads that are connected to both ends of the boding wire and formed on a semiconductor chip in which a circuit element is formed and on a capacitor chip in which a capacitor element is formed may be located to be separated from each other. In this case, the area of the semiconductor chip tends to be increased because an area in which a circuit element is formed must be reserved thereon. Accordingly, the implementation area thereof tends to be increased.

In addition, if bonding pads connected to the both ends of the bonding wire are located to be separated from the capacitor chip, the length of the boding wire tends to be prolonged. Accordingly, the path length of a portion through which a signal is transmitted may be elongated. Because of this, the transmission time of a signal tends to be prolonged.

In view of the above, it will be apparent to those skilled in the art from this disclosure that there exists a need for an improved semiconductor device that enables transmission time of a signal and implementation area to be reduced and a method for manufacturing the same. This invention addresses this need in the art as well as other needs, which will become apparent to those skilled in the art from this disclosure.

SUMMARY OF THE INVENTION

A semiconductor device in accordance with the present invention includes a first semiconductor chip, a capacitor, an external input terminal, and an external output terminal. The first semiconductor chip includes a first surface, a second surface, a first through-hole electrode, a second through-hole electrode, and a third through-hole electrode. The first surface is a surface on which a first circuit element is formed. The second surface is a surface disposed on the opposite side of the first surface. The first through-hole electrode penetrates the first semiconductor chip from the first surface to the second surface and is electrically isolated from the first circuit element. The second through-hole electrode penetrates the first semiconductor chip from the first surface to the second surface and is electrically coupled to the first circuit element. The third through-hole electrode penetrates the first semiconductor chip from the first surface to the second surface and is electrically coupled to the first circuit element. The capacitor chip is laminated on the first semiconductor chip and includes a third surface. The third surface is a surface on which a capacitor element is formed. The capacitor element functions as a peripheral condenser component of the first semiconductor chip. An external input terminal is disposed on the opposite side of the capacitor chip across the first semiconductor chip and is configured such that a signal is input therein. An external outside terminal is disposed on the opposite side of the capacitor chip across the first semiconductor chip and is configured such that a signal is externally output therefrom. Either the external input terminal or the external output terminal is electrically coupled to the capacitor element and the second through-hole electrode through the first through-hole electrode. The other of the external input terminal and the external output terminal is coupled to the first circuit element through the third through-hole electrode.

According to the semiconductor device, either the external input terminal or the external output terminal is electrically coupled to the capacitor element and the second through-hole electrode through the first through-hole electrode. In other words, a signal is allowed to be externally input into the capacitor element through the first through-hole electrode. Alternatively, a signal is allowed to be externally output from the capacitor element through the first through-hole electrode. Therefore, this enables the degree-of-freedom of the electrode arrangement to be increased, and enables the path length of a portion through which a signal is transmitted to be reduced when a signal is sent/received to/from the capacitor element, compared to a case in which either the external input terminal or the external output terminal is coupled to the capacitor element and the second through-hole electrode through a bonding wire.

Thus, the degree-of-freedom of the electrode arrangement can be increased, and the path length of a portion through which a signal is transmitted can be reduced. Therefore, the implementation area and transmission time of a signal can be reduced.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which from a part of this original disclosure.

DETAILED DESCRIPTION OF THE PREFERRED EMBODIMENT

Selected embodiments of the present invention will now be explained with reference to the drawings. It will be apparent to those skilled in the art this disclosure that the following descriptions of the embodiments of the present invention are provided for illustration only and for the purpose of limiting the invention as defined by the appended claims and their equivalents.

Figure 1:
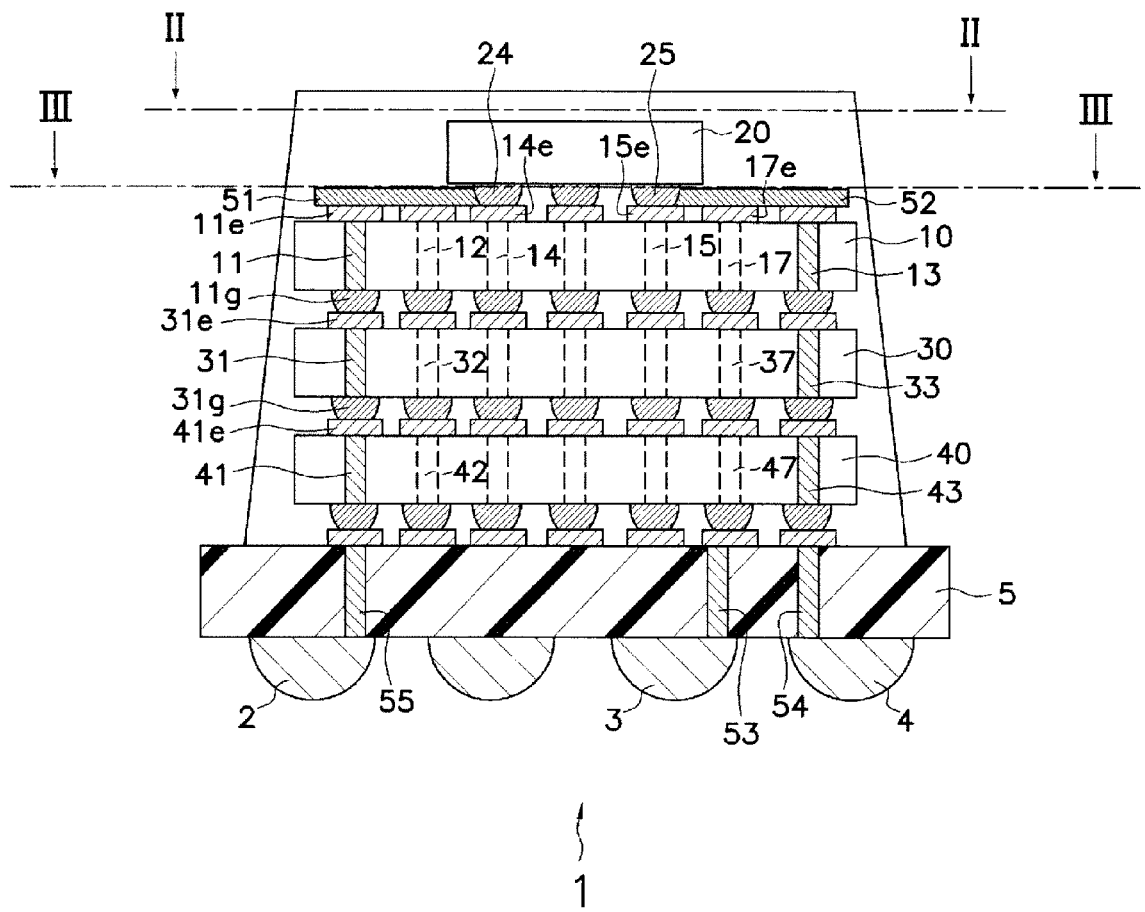
FIG. 1 is a schematic cross-sectional view of a semiconductor device in accordance with an embodiment of the present invention.
Figure 2:
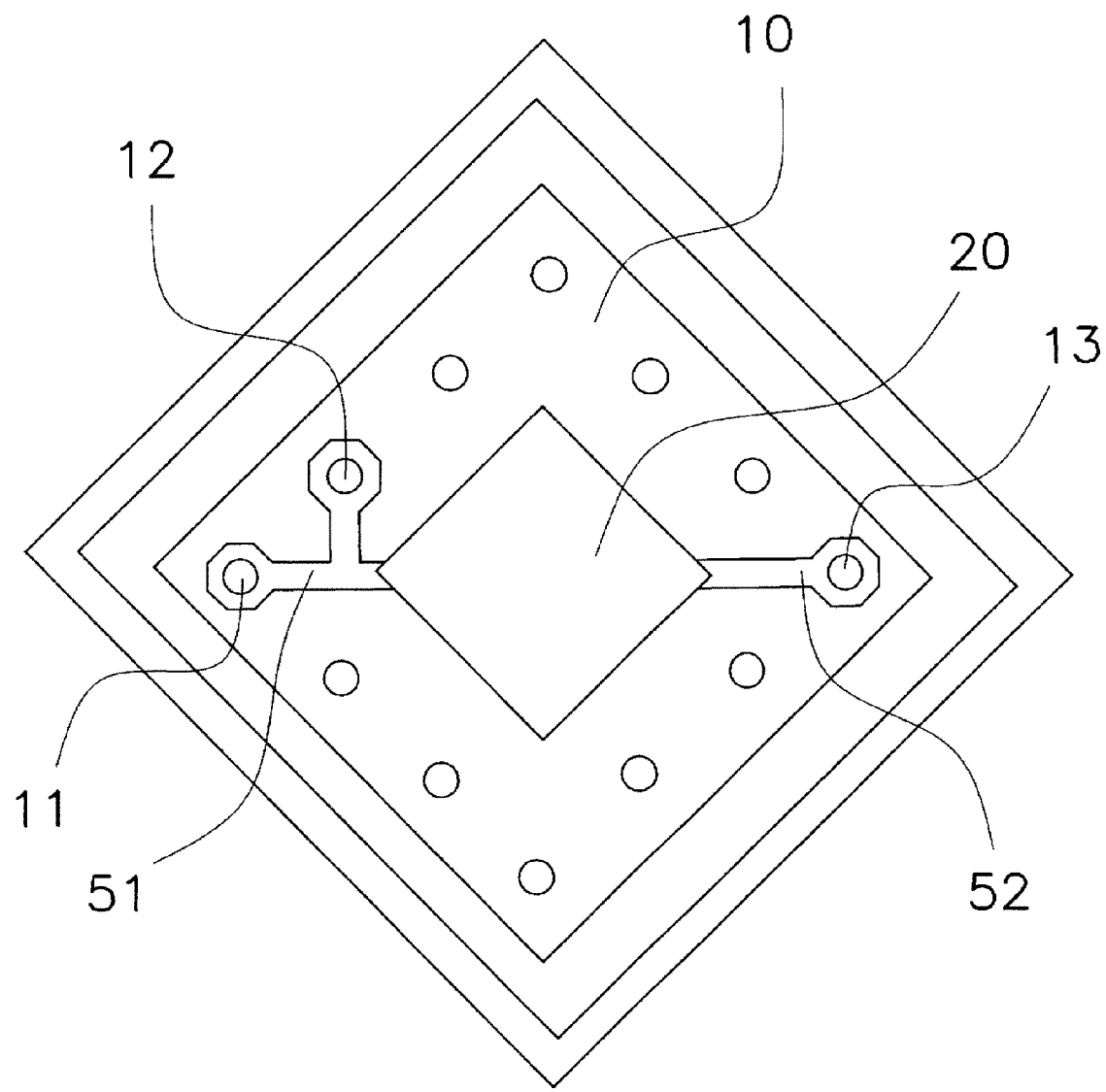
FIG. 2 is a cross-sectional view of a cross section II-II of the semiconductor device shown in FIG. 1.
Figure 3:
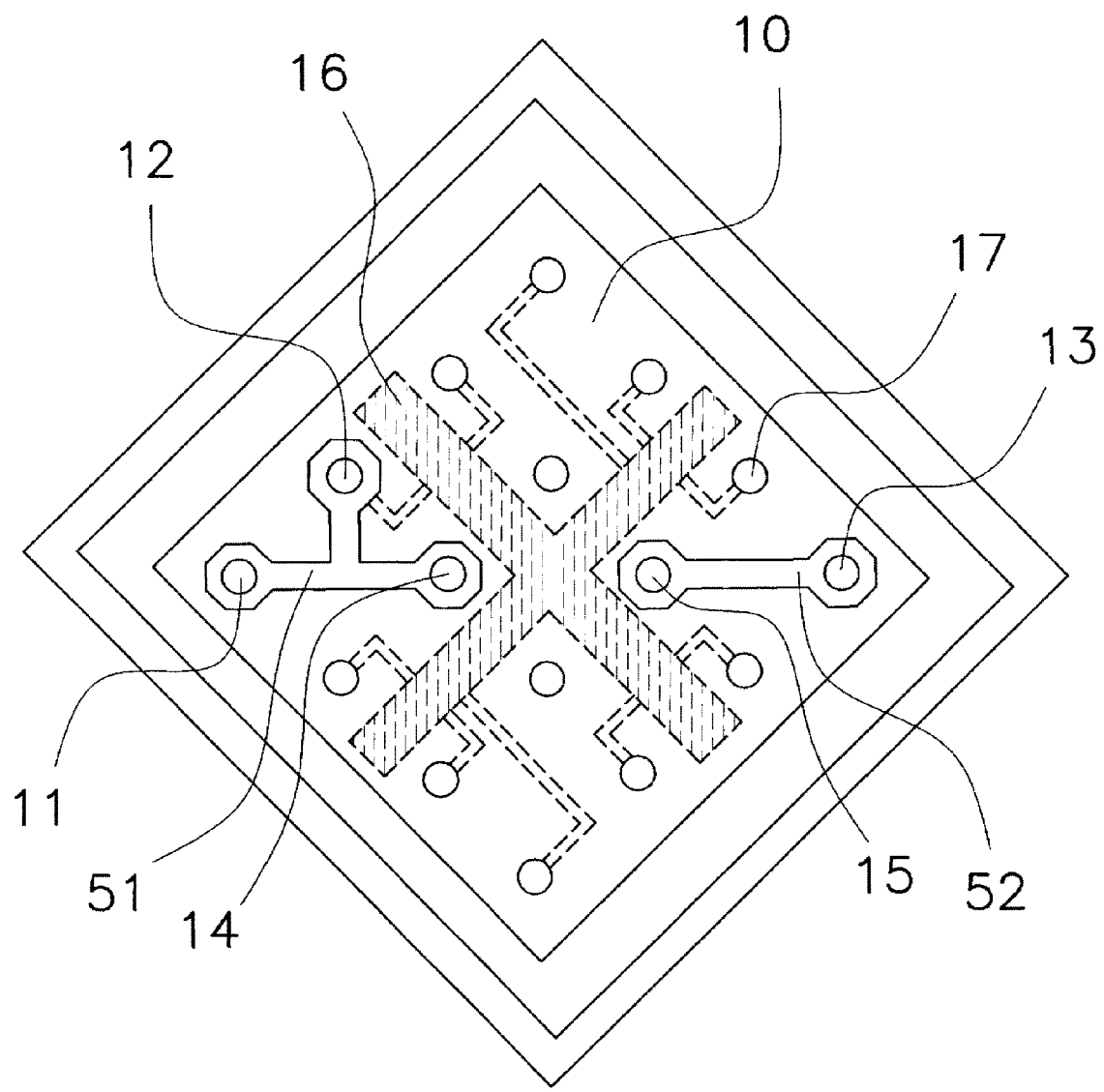
FIG. 3 is a cross-sectional view of a cross section III-III of the semiconductor device shown in FIG. 1.
Figure 4:
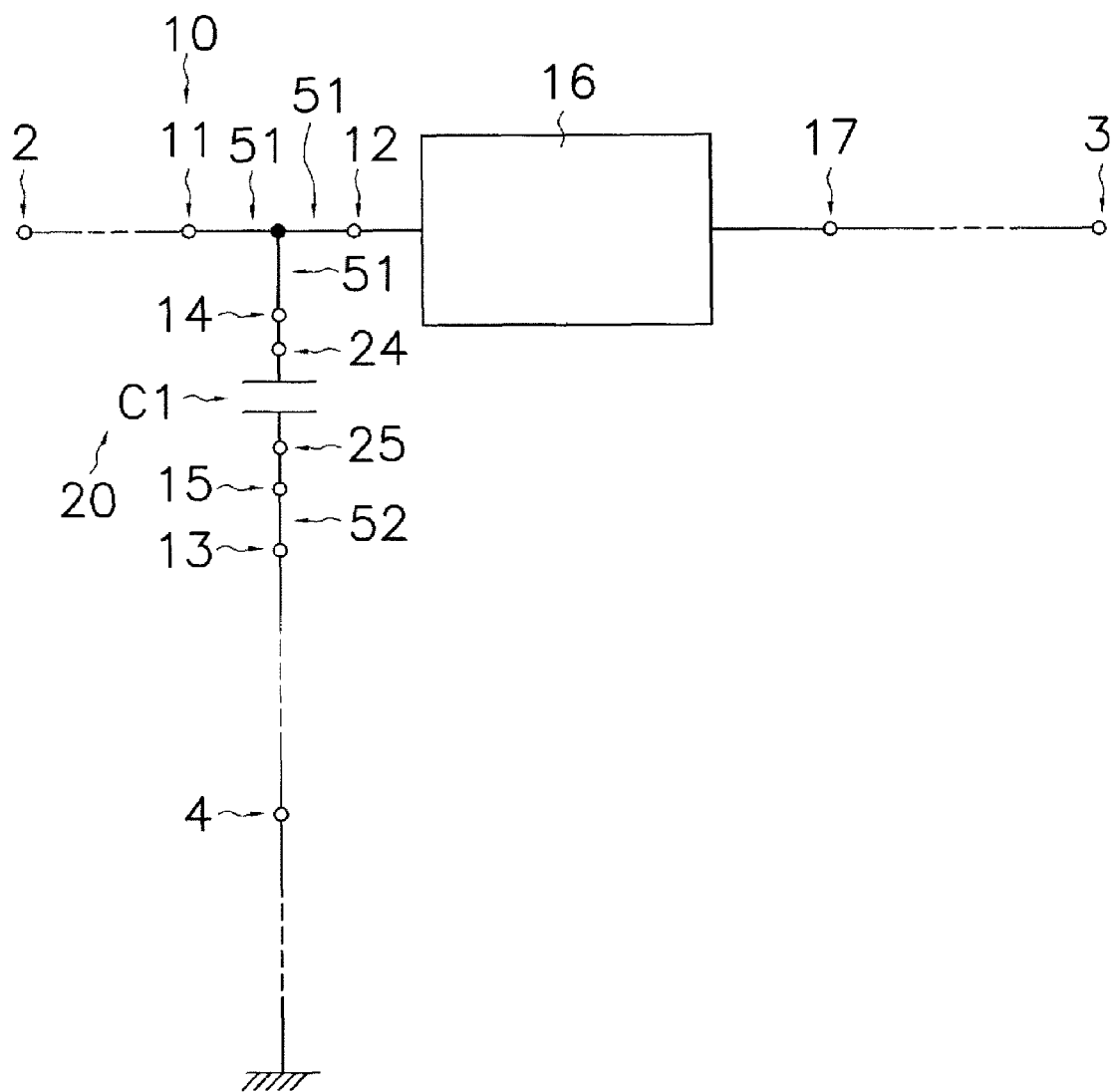
FIG. 4 is an equivalent circuit of a semiconductor device in accordance with an embodiment of the present invention.

FIG. 1 shows a schematic cross-sectional view of a semiconductor device in accordance with an embodiment of the present invention. FIG. 2 shows a cross-sectional view of a cross section II-II of the semiconductor device shown in FIG. 1. FIG. 3 shows a cross-sectional view of a cross section III-III of the semiconductor device shown in FIG. 1. FIG. 4 shows an equivalent circuit of a semiconductor device. Note that a drawing of sealing resin filled in the spaces among the semiconductor substrates is omitted in FIG. 1, and a circuit element is indicated with a dashed line in FIG. 3.

Structural Overview of Semiconductor Device

Structural overview of a semiconductor device in accordance with an embodiment of the present invention will be hereinafter explained mainly with reference to FIG. 1.

A semiconductor device 1 is chiefly composed of a semiconductor substrate 10, a capacitor chip 20, a third semiconductor substrate 30, a fourth semiconductor substrate 40, an external input terminal 2, an external output terminal 3, a ground output terminal 4, an interposer 5, a first re-wiring 51, and a second re-wiring 52.

The first semiconductor substrate 10, the capacitor chip 20, the third semiconductor substrate 30, and the fourth semiconductor substrate 40 are laminated on the interposer 5 approximately parallel to each other.

Here, a circuit element (see a circuit element 16 shown in FIG. 3), an eleventh through-hole electrode 11, a twelfth through-hole electrode 12, a thirteenth through-hole electrode 13, a fourteenth through-hole electrode 14, a fifteenth through-hole electrode 15, a seventeenth through-hole electrode 17, and the like are formed in/on the first semiconductor substrate 10. The eleventh through-hole electrode 11, the twelfth through-hole electrode 12, the thirteenth through-hole electrode 13, and the seventeenth through-hole electrode 17 are formed to pass through the first semiconductor substrate 10 from the upper surface (i.e., top) to the lower surface (i.e., bottom). Because of this, the top and the bottom of the first semiconductor substrate 10 are configured to be able to communicate an electric signal. Note that configurations of the third semiconductor substrate 30 and the fourth semiconductor substrate 40 are the same as the configuration of the first semiconductor substrate 10.

A capacitor element C1 (see FIG. 5) to be described below is formed on the capacitor chip 20. In other words, a simple element is formed on the capacitor chip 20, compared to the first semiconductor substrate 10, the third semiconductor substrate 30, and the fourth semiconductor substrate 40. Therefore, the area of the capacitor chip 20 is formed to be smaller than those of the first semiconductor substrate 10, the third semiconductor substrate 30, and the fourth semiconductor substrate 40, while those of the first semiconductor substrate 10, the third semiconductor substrate 30, and the fourth semiconductor substrate 40 are approximately the same as each other. Note that the capacitor chip 20 is located across the first semiconductor substrate 10 from the external input terminal 2 and the external output terminal 3. In other words, it is laminated on the top of the laminated semiconductor substrates.

The first re-wiring 51 is formed to extend horizontally so that it connects the capacitor chip 20, and the eleventh through-hole electrode 11 and the twelfth through-hole electrode 12. The second re-wiring 52 is formed to extend horizontally so that it connects the thirteenth through-hole electrode 13 and the capacitor chip 20.

On the other hand, the external input terminal 2, the external output terminal 3, the ground output terminal 4, and the like are formed immediately below the interposer 5. The interposer 5 is chiefly composed of an insulating resin. In addition, a through-hole wiring 53, a through-hole wiring 54, and a through-hole wiring 55, and the like are formed therein.

Circuit Configuration of Semiconductor Device

The circuit configuration of the semiconductor device in accordance with an embodiment of the present invention will be hereinafter explained mainly with reference to FIGS. 1 and 4.

The external input terminal 2 is coupled to the eleventh through-hole electrode 11 through the through-hole wiring 55, a forty-first through-hole electrode 41, and a thirty-first through-hole electrode 31. The eleventh through-hole electrode 11 is coupled to the twelfth through-hole electrode 12 and the fourteenth through-hole electrode 14 through the first re-wiring 51 so that it branch off in two directions (See FIG. 3).

The twelfth through-hole electrode 12 is connected to the input side of the circuit element 16. The external output terminal 3 is coupled to the output side of the circuit element 16 through the seventeenth through-hole electrode 17 (see FIG. 3), a thirty-seventh through-hole electrode 37, a forty-seventh through-hole electrode 47, and the through-hole wiring 53.

Figure 5:
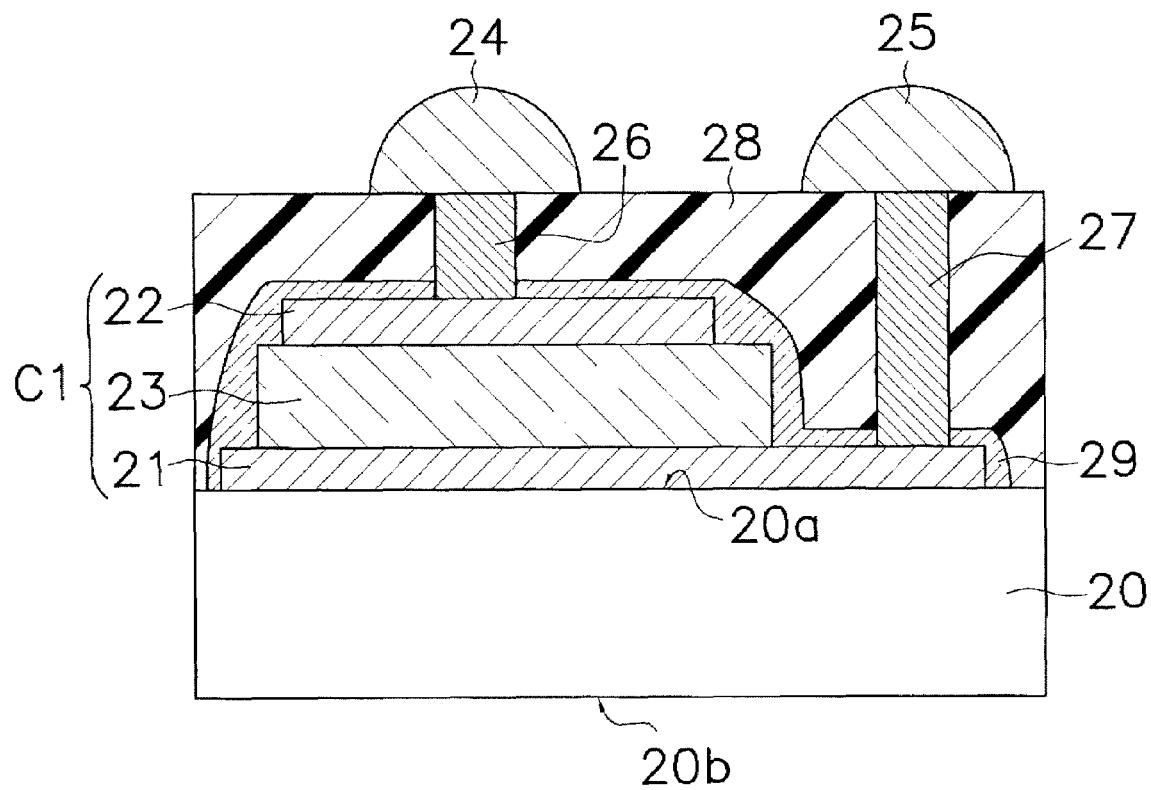
FIG. 5 is an enlarged cross-sectional view of a second semiconductor substrate in accordance with an embodiment of the present invention.

On the other hand, the fourteenth through-hole electrode 14 is coupled to either of electrodes of the capacitor element C1 formed on the capacitor chip 20 through a solder ball 24 (see FIG. 5). The ground output terminal 4 is coupled to the other electrode of the capacitor element C1 through a solder ball 25 (see FIG. 5), the fifteenth through-hole electrode 15, the second re-wiring 52, the thirteenth through-hole electrode 13, a thirty-third through-hole electrode 33, a forty-third through-hole electrode 43, and the through-hole wiring 54. Furthermore, the ground output terminal 4 is coupled to the ground level.

Operational Overview of Semiconductor Device

An operational overview of the semiconductor device in accordance with an embodiment of the present invention will be hereinafter explained with reference to FIGS. 1 to 4.

An externally input signal through the external input terminal 2 is transmitted to the first re-wiring 51 through the through-hole wiring 55, the forty-first through-hole electrode 41, the thirty-first through-hole electrode 31, and the eleventh through-hole electrode 11. Here, high-frequency noise contained in a signal that is transmitted to the first re-wiring 51 will be allowed to escape to the ground level through the solder ball 24, the capacitor element C1, the solder ball 25, the thirteenth through-hole electrode 13, the thirty-third through-hole electrode 33, the forty-third through-hole electrode 43, the through-hole wiring 54, and the ground output terminal 4.

On the other hand, a signal that is transmitted to the first re-wiring 51 is input into the circuit element 16 through the twelfth through-hole electrode 12 in a state that the high-frequency noise is removed therefrom.

Furthermore, a signal that is output from the circuit element 16 is externally output through the seventeenth through-hole electrode 17, the thirty-seventh through-hole electrode 37, the forty-seventh through-hole electrode 47, the through-hole wiring 53, and the external output terminal 3.

Detailed Configuration and Operation of Capacitor Chip

FIG. 5 shows an enlarged cross-sectional view of the capacitor chip. Note that the top and the bottom of the capacitor in FIG. 5 is shown to be turned upside down, compared to those of the capacitor shown in FIG. 1.

The capacitor chip 20 has a twenty-first surface 20a and a twenty-second surface 20b. The capacitor element C1, the solder ball 24, the solder ball 25, a metal post 26, a metal post 27, and a sealing resin 28 are chiefly formed on the twenty-first surface 20a. Note that the twenty-second surface 20b is the surface of the capacitor chip 20 that is located opposite from the twenty-first surface 20a.

The capacitor element C1 is formed to extend along the twenty-first surface 20a. The capacitor element C1 is chiefly composed of a first conductive layer 21, a capacitor insulating layer 23, and a second conductive layer 22. The first conductive layer 21 chiefly consists of conductive material, and is formed on the entirety of the twenty-first surface 20a. The capacitor insulating layer 23 chiefly consists of insulating material, and is formed to be located immediately above the first conductive layer 21. The second conductive layer 22 chiefly consists of conductive material, and is formed to be located immediately above the capacitor insulating layer 23. Furthermore, a protection film 29 is formed to cover the first conductive layer 21, the capacitor insulating layer 23, and the second conductive layer 22.

Here, the first conductive layer 21 is formed to have the dimension of (55 μm)×(75 μm) and the thickness of approximately 100 Å, for instance. The capacitor insulating layer 23 chiefly consists of insulating material (e.g., material of Ba—Sr—Ti—O system or Sr—Bi—Ta—O system) whose permittivity is larger than that of $SiO_2$ (e.g., permittivity is approximately 800), and is formed to have the dimension of (53 μm)×(60 μm) and the thickness of approximately 0.15 μm, for instance. The second conductive layer 22 is formed to have the dimension of (50 μm)×(50 μm) and the thickness of approximately 100 Å, for instance. A plurality of layers including these are arranged in the capacitor element C1. Therefore, the capacitor element C1 is configured to have capacitance (e.g., 2000 to 3000 pF) that is much larger than that of the capacitor element (normally approximately 0.1 to 1.5 pF) that is formed in a general semiconductor memory element. In other words, it is configured to be able to remove high-frequency noise from a sent/received signal.

The solder ball 24 is coupled to the second conductive layer 22 through the metal post 26. The solder ball 25 is coupled to the first conductive layer 21 through the metal post 27. The sealing resin 28 is filled in a space between the metal post 26 and the metal post 27. Because of this, it will be easier to electrically access the first conductive layer 21 and the second conductive layer 22 of the capacitor element C1 separately.

Detailed Configuration and Operation of First Semiconductor Substrate

Figure 6:
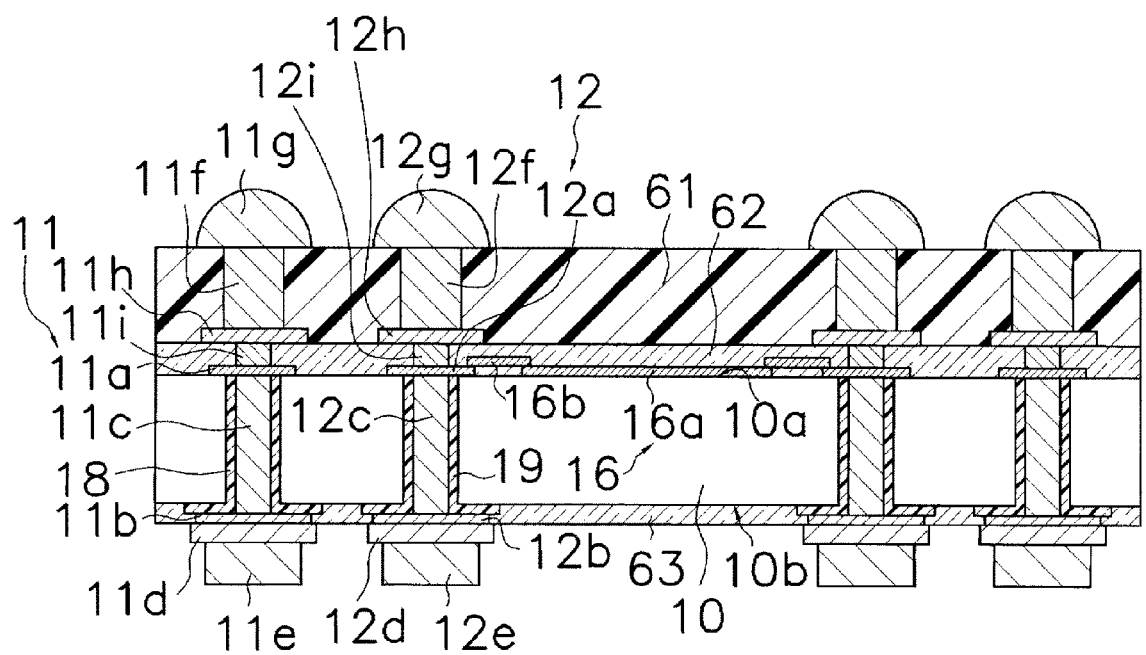
FIG. 6 is an enlarged cross-sectional view of a first semiconductor substrate in accordance with an embodiment of the present invention.

FIG. 6 shows an enlarged cross-sectional view of the first semiconductor substrate. Note that the top and the bottom of the semiconductor substrate in FIG. 6 is shown to be turned upside down, compared to those of the semiconductor substrate shown in FIG. 1.

The first semiconductor substrate 10 includes an eleventh surface 10a, a twelfth surface 10b, the eleventh through-hole electrode 11, the twelfth through-hole electrode 12, the thirteenth through-hole electrode 13 (see FIG. 1), and other members. The circuit element 16, a protection film 62, and a sealing resin 61 are chiefly formed on the eleventh surface 10a. Note that the twelfth surface 10b is the surface of the first semiconductor substrate 10 that is located opposite from the eleventh surface 10a. The protection film 63 is chiefly formed on the twelfth surface 10b. In addition, the eleventh through-hole electrode 11, the twelfth through-hole electrode 12, the thirteenth through-hole electrode 13, the seventeenth through-hole electrode 17 (see FIG. 1) and other members are formed to pass through the first semiconductor substrate 10 so that the eleventh surface 10a side and the twelfth surface 10b side are electrically connected to each other.

The eleventh through-hole electrode 11 chiefly includes an upper electrode 11a, a lower electrode 11b, a through-hole wiring 11c, an interconnecting electrode 11h, an interconnecting wiring 11i, a metal post 11f, a solder ball 11g, a backside wiring 11d, and a land 11e. The through-hole wiring 11c is formed to pass through the semiconductor substrate 10 from the eleventh surface 10a to the twelfth surface 10b. The upper electrode 11a and the lower electrode 11b are electrically coupled to each other through the through-hole wiring 11c. The solder ball 11g is coupled to the upper electrode 11a through the interconnecting wiring 11i, the interconnecting electrode 11h, the metal post 11f. The land 11e is coupled to the lower electrode 11b through the backside wiring 11d. Thus, the solder ball 11g and the land 11e are electrically coupled to each other.

The twelfth through-hole electrode 12 chiefly includes an upper electrode 12a, a lower electrode 12b, a through-hole wiring 12c, an interconnecting electrode 12h, an interconnecting wiring 12i, a metal post 12f, a solder ball 12g, a backside wiring 12d, and a land 12e. The through-hole wiring 12c is formed to pass through the semiconductor substrate 10 from the eleventh surface 10a to the twelfth surface 10b. The upper electrode 12a and the lower electrode 12b are electrically coupled to each other through the through-hole wiring 12c. The solder ball 12g is coupled to the upper electrode 12a through the metal post 12f. The land 12e is coupled to the lower electrode 12b through the backside wiring 12d. Thus, the solder ball 12g and the land 12e are electrically coupled to each other.

A circuit element 16 chiefly includes an internal circuit 16a and a connection wiring 16b. In FIG. 6, the circuit element 16 is shown to have a single layer for a simplified explanation. However, the circuit element 16 is actually formed to have a more complex configuration. For example, an interlayer film may be formed in the circuit element 16 so that it is located to contact the first semiconductor substrate 10.

Here, when the eleventh through-hole electrode 11 and the twelfth through-hole electrode 12 are compared, they are different from each other in that the eleventh through-hole electrode 11 is electrically isolated from the circuit element 16 but the twelfth through-hole electrode 12 is electrically coupled to the circuit element 16. In other words, the twelfth through-hole electrode 12 is different from the eleventh through-hole electrode 11 in that it is coupled to the internal circuit 16a through the upper electrode 12a and the connection wiring 16b. Thus, a signal is configured to be provided to the circuit element 16 through the twelfth through-hole electrode 12.

In addition, when the thirteenth through-hole electrode 13 and the seventeenth through-hole electrode 17 (see FIG. 1) are compared, they are different from each other in that the thirteenth through-hole electrode 13 is electrically isolated from the circuit element 16 but the seventeenth through-hole electrode 17 is electrically coupled to the circuit element 16. Thus, a signal is configured to be able to be output from the circuit element 16 to the external output terminal 3 through the seventeenth through-hole electrode 17. Furthermore, the thirteenth electrode 13 (see FIGS. 4 and 5) that is electrically coupled to the first conductive layer 21 of the capacitor element C1 on the capacitor chip 20 is electrically isolated from the circuit element 16. Therefore, high-frequency noise is allowed to escape to the ground level without mixing into a signal in the circuit element 16.

Manufacturing Method of Semiconductor Device

A method configured to manufacture a semiconductor device will be hereinafter explained with reference to FIGS. 1 and 5 and cross-sectional views of manufacturing steps thereof shown in FIGS. 6, 7A to 7C, 8A to 8C, and 9A to 9B. Note that manufacturing methods of the eleventh through-hole electrode 11 and the twelfth through-hole electrode 12 will be hereinafter explained, and those of other through-hole electrodes (e.g., the thirteenth electrode 13 and the like) will be hereinafter omitted. However, the other through-hole electrodes are formed in the similar way used for forming the eleventh through-hole electrode 11 and the twelfth through-hole electrode 12.

Figure 7A:
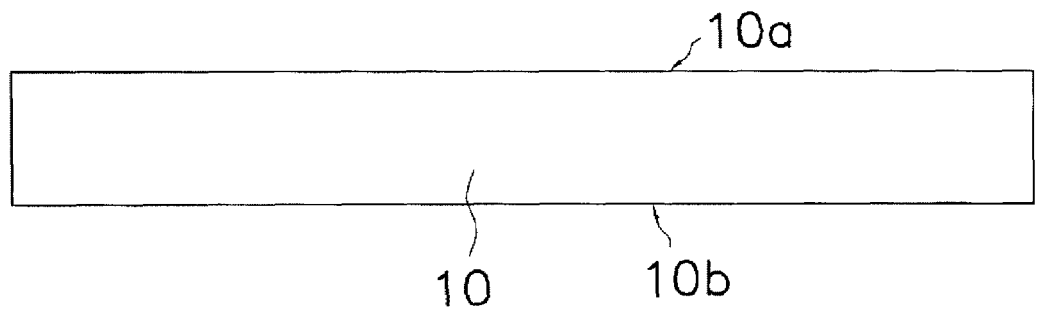
FIGS. 7A, 7B, and 7C are cross-sectional views showing manufacturing steps of a semiconductor device.

As shown in FIG. 7A, a first semiconductor substrate is prepared in a preparation step S1. Here, a first semiconductor substrate 10 includes an eleventh surface 10a and a twelfth surface 10b.

Figure 7B:
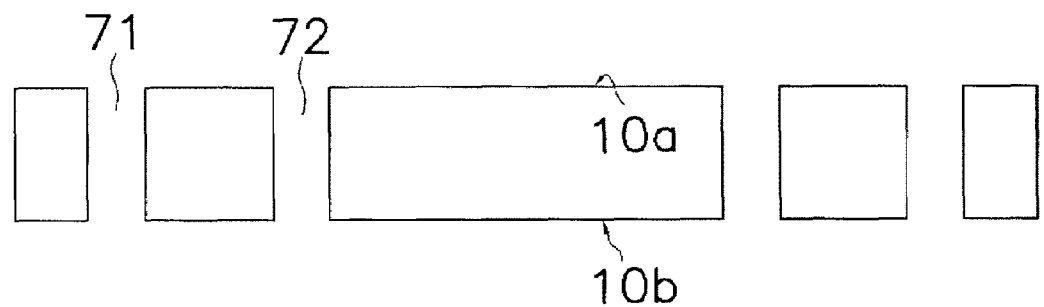
Figure 7C:
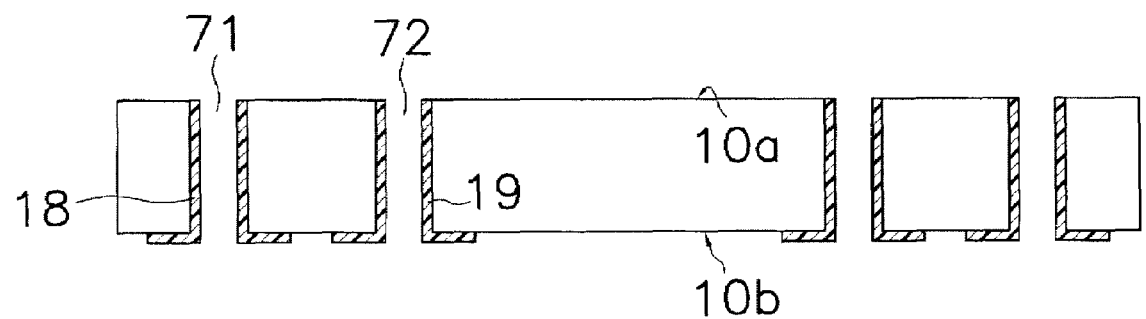
Figure 8A:
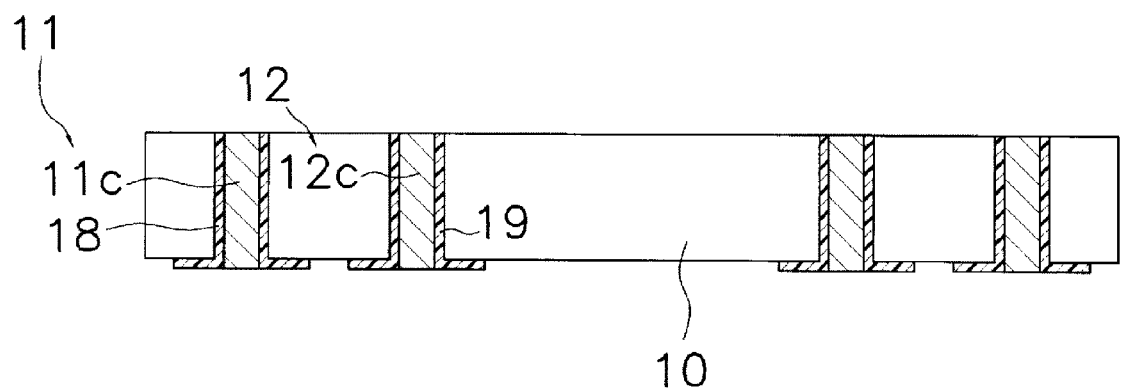
FIGS. 8A, 8B, and 8C are cross-sectional views showing manufacturing steps of a semiconductor device.

Next, as shown in FIGS. 7B, 7C, and 8A, an eleventh through-hole electrode 11 and a twelfth through-hole electrode 12 will be formed in a through-hole electrode formation step S2. In other words, as shown in FIG. 7B, through-holes 71 and 72 will be formed so that they pass through a protection film 62 and the first semiconductor substrate 10 in a direction from the eleventh surface 10a to the twelfth surface 10b in a region in which a circuit element 16 is not formed (see FIG. 6). Next, as shown in FIG. 7C, insulating layers 18 and 19 are formed to extend continuously from the inner sidewalls of the through holes 71 and 72 to the vicinity of the openings on the twelfth surface 10b side. Then, as shown in FIG. 8A, through-hole wirings 11c and 12c will be formed by filling conductive material into the through holes 71 and 72.

Figure 8B:
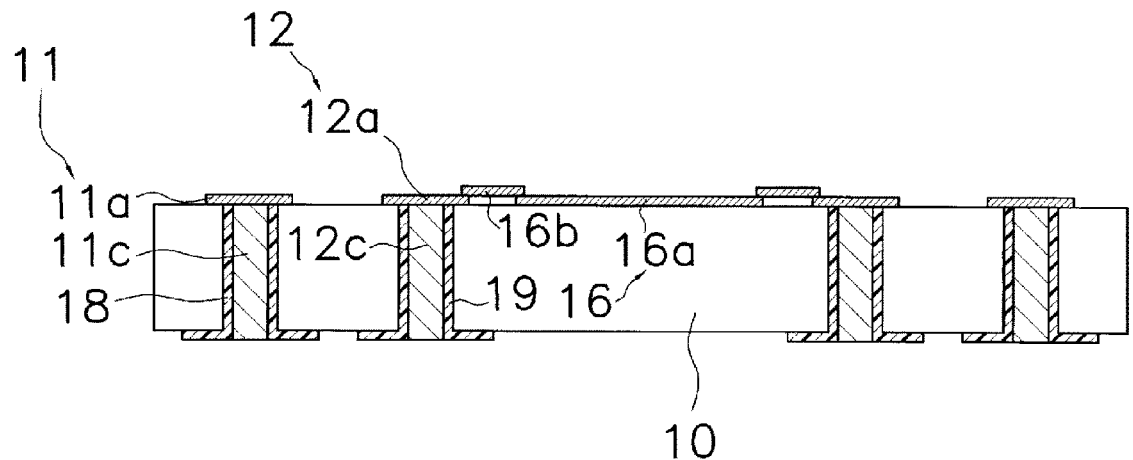
Figure 8C:
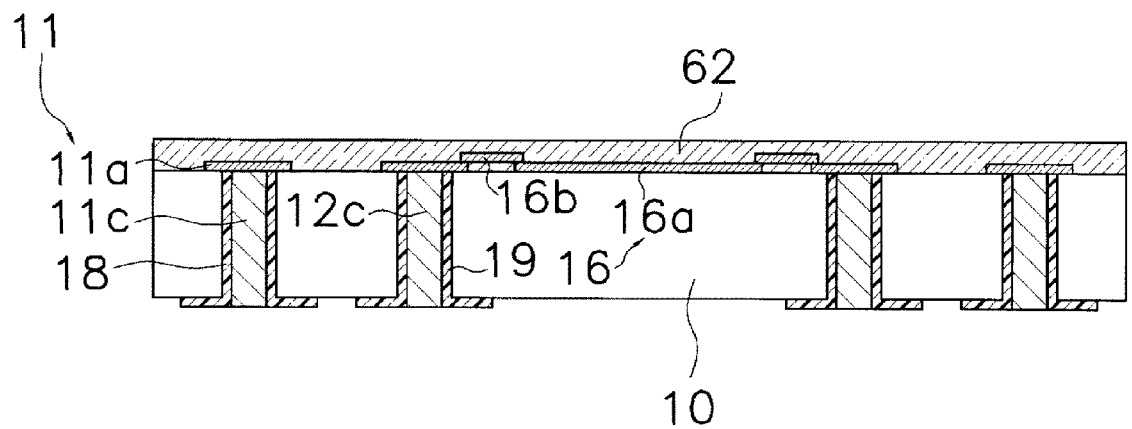

Next, as shown in FIGS. 8B and 8C, a circuit element and upper electrodes will be formed on the eleventh surface of the first semiconductor substrate in an element formation step S3. More specifically, a circuit element 16 (i.e., an internal circuit 16a and a connection wiring 16b) will be formed on the first surface 10a of the first semiconductor substrate 10 by means of a photolithography step and the like. In addition, upper electrodes 11a and 12a will be formed on the eleventh through-hole electrode 11 and the twelfth through-hole electrode 12, respectively. In FIG. 8B, a circuit element 16 (i.e., the internal circuit 16a and the connection wiring 16b) is shown to have a single layer for a simplified explanation. However, it is actually formed to have a more complex configuration. Then, as shown in FIG. 8C, the protection film 62 will be formed on the circuit element 16, and the upper electrodes 11a and 12a.

Figure 9A:
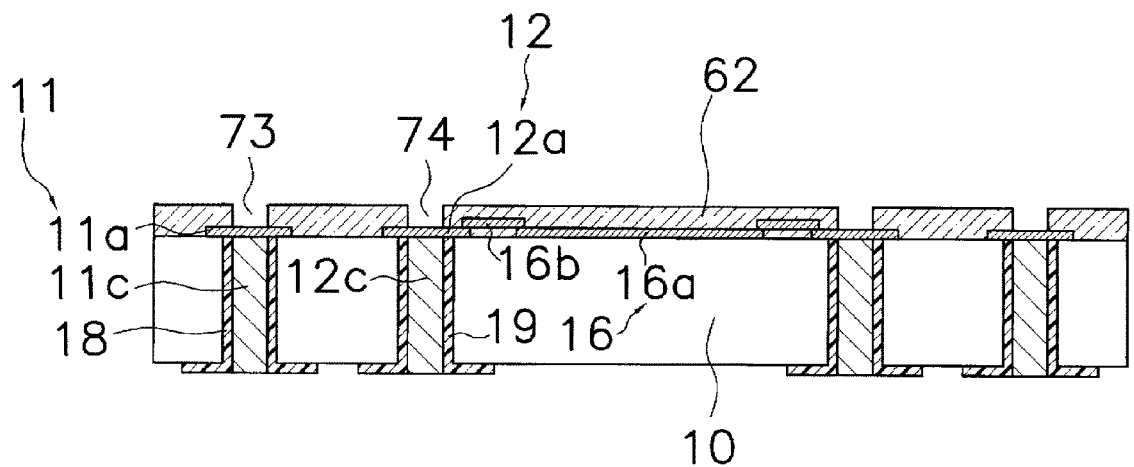
FIGS. 9A and 9B are cross-sectional views showing manufacturing steps of a semiconductor device.
Figure 9B:
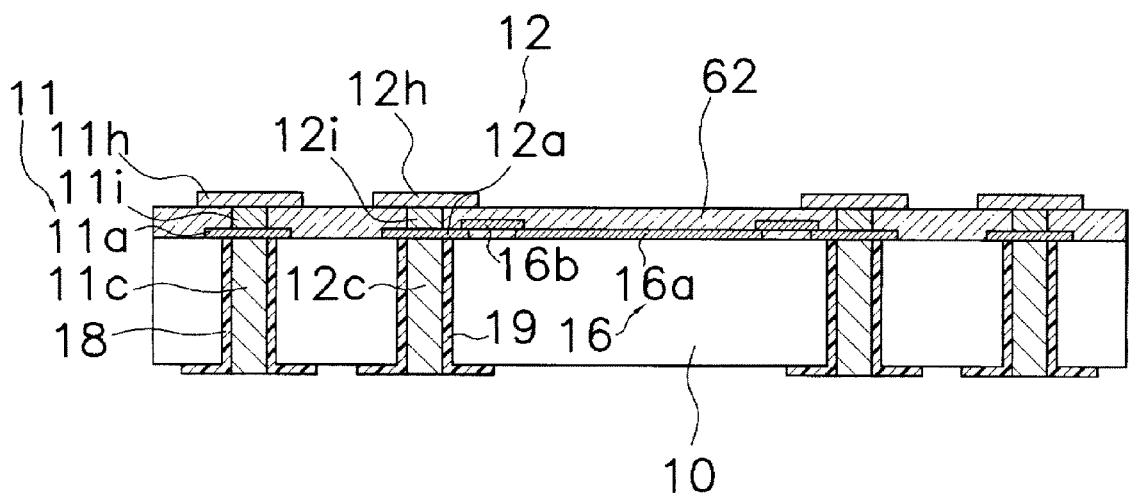

Next, as shown in FIGS. 9A and 9B, an interconnecting electrode and an interconnecting wiring will be formed in an interconnecting electrode formation step S4. More specifically, as shown in FIG. 9A, portions of the protection film 62 located immediately above the upper electrodes 11a and 12a will be removed, and openings 73 and 74 will be formed. Then, interconnecting wirings 11i and 12i will be formed by filling the openings 73 and 74 with conductive material. In addition, interconnecting electrodes 11h and 12h will be formed immediately above the interconnecting wirings 11i and 11i, respectively, by means of a photolithography step and the like.

Next, a lower electrode, a protection film, and a backside wiring will be formed on the twelfth surface of the first semiconductor substrate in a backside wiring formation step S5. More specifically, lower electrodes 11b and 12b will be formed immediately below the eleventh through-hole electrode 11 and the twelfth through-hole electrode 12, respectively. Then, a protection film 63 will be formed to fill spaces including a space between the lower electrodes 11b and 12b. In addition, backside wirings 11d and 12d will be formed immediately below the lower electrodes 11b and 12b, respectively.

Next, resin seal will be performed to fill the first semiconductor substrate with a resin in a first resin sealing step S6. More specifically, as shown in FIG. 6, metal posts 11f and 12f are formed, and a sealing resin 61 will be filled with a space between the metal posts 11f and 12f. Furthermore, solder balls 11g and 12g will be formed on the metal posts 11f and 12f, respectively. On the other hand, lands 11e and 12e will be formed immediately below the backside wirings 11d and 12d, respectively.

A third semiconductor substrate 30 and a fourth semiconductor substrate 40 will be formed in steps that are similar to the steps S1 to S6.

Next, the first semiconductor substrate, the third semiconductor substrate, and the fourth semiconductor substrate will be laminated in a first lamination step S7. More specifically, as shown in FIG. 1, the third semiconductor substrate 30 will be laminated on the fourth semiconductor substrate 40 so that a solder ball 31g of the third semiconductor substrate 30 contacts a land 41e of the fourth semiconductor substrate 40. Then, the first semiconductor substrate 10 will be laminated on the third semiconductor substrate 30 so that the solder ball 11g of the first semiconductor substrate 10 contacts a land 31e of the third semiconductor substrate 30.

Next, a re-wiring layer will be formed on a land of the first semiconductor substrate in a re-wiring layer formation step S8. More specifically, as shown in FIG. 1, a re-wiring layer 51 will be formed on the land 11e of the first semiconductor substrate 10 so that the eleventh through-hole electrode 11, the twelfth through-hole electrode 12, and a fourteenth through-hole electrode 14 are coupled to each other (see FIG. 3). In addition, a re-wiring layer 52 will be formed on the land 17e of the first semiconductor substrate 10 so that a fifteenth through-hole electrode 15 and a thirteenth through-hole electrode 13 are coupled to each other (see FIG. 3).

Next, a capacitor chip will be further laminated on the first semiconductor substrate in a second lamination step S8. More specifically, a capacitor chip 20 will be laminated on the first semiconductor substrate 10 so that a solder ball 24 formed on the capacitor chip 20 contacts a land 14e of the fourteenth through-hole electrode 14 and a solder ball 25 contacts a land 15e of the fifteenth through-hole electrode 15 (see FIG. 2).

Next, a sealing resin will be filled with the spaces among the capacitor chip, the first semiconductor substrate, the third semiconductor substrate, and the fourth semiconductor substrate in a second resin sealing step S9.

Features of Semiconductor Device

First, the external input terminal 2 is herein electrically coupled to the capacitor element C1 and the twelfth through-hole electrode 12 through the eleventh through-hole electrode 11. In other words, the capacitor element C1 is configured so that a signal is externally input therein through the first through-hole electrode 11. Because of this, the degree-of-freedom of the electrode arrangement is increased, and the path length of a portion through which a signal is transmitted is reduced when a signal is transmitted to the capacitor element C1, compared to a case in which the external input terminal 2 is coupled to the capacitor element C1 and the through-hole electrode 12 through a bonding wire.

As described above, according to the present embodiment, the degree-of-freedom of electrode arrangement is increased, and path length of a portion through which a signal is transmitted is reduced. Accordingly, the implementation area and transmission time for a signal will be reduced.

Second, the second conductive layer 22 of the capacitor element C1 is herein coupled to the external input terminal 2 through the eleventh through-hole electrode 11, and coupled to the circuit element 16 through the twelfth through-hole electrode 12. In addition, the first conductive layer 21 is coupled to the ground level. Because of this, a signal that is externally input into the external input terminal 2 is configured to be input into the circuit element 16 in a state that high-frequency noise escapes to the ground level.

Third, the capacitor element C1 is herein coupled to the external input terminal 2 through the eleventh through-hole electrode 11 and the thirty-first through-hole electrode 31. Because of this, even if a plurality of semiconductor substrates on which a circuit element is formed are used, the degree-of-freedom of the electrode arrangement will be increased when a signal is transmitted to the capacitor element C1. Accordingly, the path length of a portion through which a signal is transmitted will be reduced.

Alternative Embodiment

First, rather than forming three semiconductor substrates (i.e., semiconductor substrates 10, 30, and 40) on which a circuit element is formed, four or more semiconductor substrates may be laminated in the semiconductor device. In addition, only one semiconductor substrate may be used in the semiconductor device. Furthermore, two semiconductor substrates may be laminated in the semiconductor device.

Second, the capacitor element C1 may be formed with the wafer-level chip size package (WCSP) technique.

Figure 10:
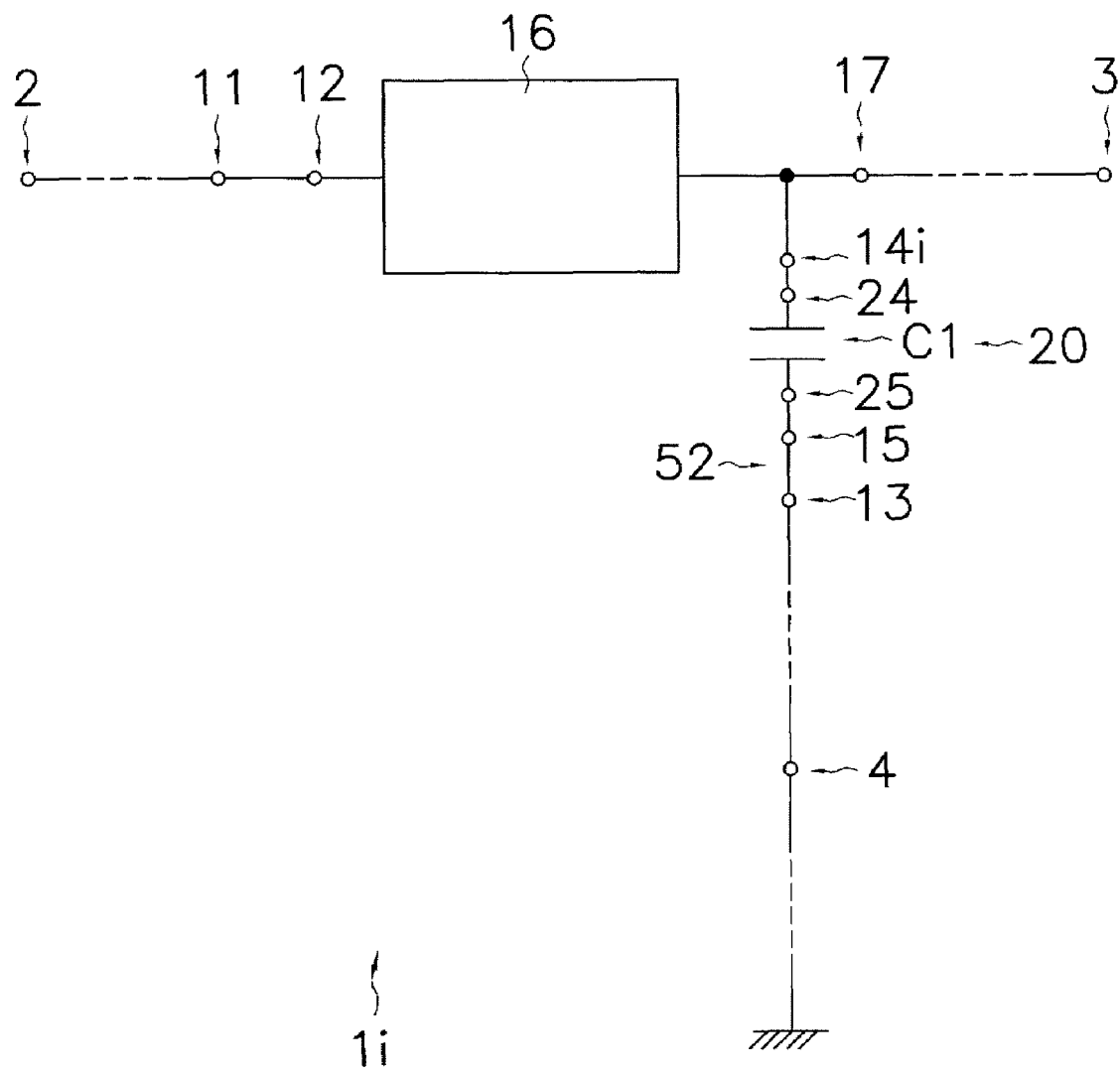
FIG. 10 is an equivalent circuit of a semiconductor device in accordance with an alternative embodiment of the present invention.

Third, the capacitor element C1 may be coupled to the output side of the circuit element 16 instead of being coupled to the input side thereof. In other words, as shown in FIG. 10, a semiconductor substrate 1i includes a fourteenth through-hole electrode 14i instead of including the above described fourteenth through-hole electrode 14. The fourteenth through-hole electrode 14i is coupled to the output side of the circuit element 16 and a seventeenth through-hole electrode 17 so that it branches off in two directions. Because of this, the second conductive layer 22 of the capacitor element C1 is configured to be coupled to the external output terminal 3 through the seventeenth through-hole electrode 17. Because of this, a signal that is output from the circuit element 16 is configured to be able to be externally output from the external output terminal in a state that high-frequency noise escapes to the ground level.

Note that the equivalent circuit used in the semiconductor device may be formed by a combination of those shown in FIGS. 4 and 10.

The semiconductor device and the method configured to manufacture the same in accordance with the present invention are useful, in that they have an effect that transmission time for a signal is allowed to be reduced and implementation area is allowed to be reduced.

As described above, according to the present invention, a method for manufacturing a semiconductor device includes the steps of preparing a first semiconductor chip, forming a first circuit on the first surface of the semiconductor chip, forming a first through-hole electrode, a second through-hole electrode, and a third through-hole electrode, and laminating a capacitor chip on the first semiconductor chip. In a step of preparing a first semiconductor chip, a first semiconductor chip is prepared, and the first semiconductor chip includes a first surface and a second surface. Here, the second surface is disposed on the opposite side of the first surface. In a step of forming a first circuit element, a first circuit element is formed on the first surface of the first semiconductor chip. In a step of forming first, second, and third through-hole electrodes, a first through-hole electrode, a second through-hole electrode, and a third through-hole electrode are formed. Here, the first through-hole electrode penetrates the first semiconductor chip from the first surface to the second surface and is electrically isolated form the first circuit element. The second and third through-hole electrodes penetrate the first semiconductor chip from the first surface to the second surface and are electrically coupled to the first circuit element. In a step of laminating a capacitor chip, a capacitor chip is laminated on the semiconductor chip. Here, the capacitor chip includes a third surface, and a capacitor element is formed on the third surface. The capacitor element functions as a peripheral condenser component of the first semiconductor chip. A step of electrically coupling either of external input and output terminals to the capacitor element and second through-hole electrode and coupling the other of them to the first circuit element is performed at the same time as the step of laminating the capacitor chip on the first semiconductor chip. Here, either the external input terminal or the external output terminal is electrically coupled to the capacitor element and the second through-hole electrode through the first through-hole electrode, and the other of the external input terminal and the external output terminal is coupled to the first circuit element through the third through-hole electrode. The external input terminal is disposed on the opposite side of the capacitor chip across the first semiconductor chip, and is configured such that a signal is externally input therein. The external output terminal is disposed on the opposite side of the capacitor chip across the first semiconductor chip, and is configured such that a signal is externally output therefrom.

According to the method for manufacturing the semiconductor device, either the external input terminal or the external output terminal is allowed to be electrically coupled to the capacitor element and the second through-hole electrode through the first through-hole electrode at the same time as the step of laminating the capacitor chip on the first semiconductor chip. In other words, a signal is allowed to be externally input into the capacitor element through the first through-hole electrode. Alternatively, a signal is allowed to be output from the capacitor element through the first through-hole electrode. Therefore, this enables the degree-of-freedom of the electrode arrangement to be increased, and enables the path length of a portion through which a signal is transmitted to be reduced when a signal is sent/received to/from the capacitor element, compared to a case in which either the external input terminal or the external output terminal is coupled to the capacitor element and the second through-hole electrode through a bonding wire.

Thus, the degree-of-freedom of electrode arrangement is allowed to be increased, and the path length of a portion through which a signal is transmitted is allowed to be decreased. Therefore, implementation area and transmission time of a signal is allowed to be reduced.

General Interpretation of Terms

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applied to words having similar meanings such as the terms, "including," "having," and their derivatives. Also, the term "part," "section," "portion," "member," or "element" when used in the singular can have the dual meaning of a single part or a plurality of parts. Finally, terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device, comprising:
a first semiconductor chip having first and second surfaces and having a first circuit element therein, the first semiconductor chip comprising a first through-hole electrode, a second through-hole electrode, and a third through-hole electrode, the second surface disposed on a side opposite the first surface, the first through-hole electrode penetrating through the first semiconductor chip from the first surface to the second surface and electrically isolated from the first circuit element, the second and third through-hole electrodes penetrating through the first semiconductor chip from the first surface to the second surface and electrically coupled to the first circuit element;
a capacitor chip laminated on the first semiconductor chip, the capacitor chip comprising a third surface, the third surface having a capacitor element thereon, the capacitor element is a peripheral condenser component of the first semiconductor chip;
an external input terminal disposed on a side of the capacitor chip opposite the third surface and across from the first semiconductor chip, the external input terminal configured such that a signal is input thereto; and
an external output terminal disposed on the opposite side of the capacitor chip across from the first semiconductor chip, the external output terminal configured such that a signal is externally output therefrom, either the external input terminal or the external output terminal electrically coupled to the capacitor element and the second through-hole electrode through the first through-hole electrode, an other of the external input terminal and the external output terminal coupled to the first circuit element through the third through-hole electrode.

2. The semiconductor device according to claim 1, wherein the capacitor element comprises a first conductive layer disposed approximately on an entirety of the third surface, a capacitor insulation layer disposed above the first conductive layer, and a second conductive layer disposed above the capacitor insulation layer, the first conductive layer coupled to the ground level, and the second conductive layer coupled to either the external input terminal or the external output terminal through the first through-hole electrode and coupled to the first circuit element through the second through-hole electrode.

3. The semiconductor device according to claim 1, further comprising a second semiconductor chip, the second semiconductor chip having a second circuit element therein, the second semiconductor chip comprising a fourth surface, a fifth surface, a fourth through-hole electrode, a fifth through-hole electrode, and a sixth through-hole electrode, the fifth surface located on a side opposite the fourth surface, the fourth through-hole electrode penetrating through the second semiconductor chip from the fourth surface to the fifth surface and electrically isolated from the second circuit element, the fifth and sixth through-hole electrodes penetrating through the second semiconductor chip from the fourth surface to the fifth surface and electrically coupled to the second circuit element; and
wherein either the external input terminal or the external output terminal is coupled to the fifth through-hole electrode through the fourth through-hole electrode, the first through-hole electrode, and the second through-hole electrode, and
an other of the external input terminal and the external output terminal is coupled to the second circuit element through the sixth through-hole electrode.

* * * * *